United States Patent [19]

Maussion

[11] 4,333,024
[45] Jun. 1, 1982

[54] METHOD AND APPARATUS FOR PROCESSING AN ANALOG SIGNAL

[75] Inventor: Daniel Maussion, Angers, France

[73] Assignee: Compagnie Internationale pour l'Informatique Cii-Honeywell Bull (Societe Anonyme), Paris, France

[21] Appl. No.: 85,959

[22] Filed: Oct. 18, 1979

[30] Foreign Application Priority Data

Oct. 25, 1978 [FR] France .............................. 78 30399

[51] Int. Cl.³ .......................... H03K 5/00; H03K 5/22
[52] U.S. Cl. .................................. 307/351; 307/494; 307/542; 328/28; 328/150
[58] Field of Search ............... 307/351, 352, 360, 542, 307/494; 328/150, 151, 28

[56] References Cited

U.S. PATENT DOCUMENTS

| 3,344,284 | 9/1967 | Thompson | 307/542 |
| 3,838,448 | 9/1974 | Garde et al. | 360/45 |
| 3,909,594 | 9/1975 | Allais et al. | 250/567 |
| 3,982,434 | 9/1976 | McMartrie | 307/351 |
| 4,012,715 | 3/1977 | Essenmacher | 307/235 R |
| 4,123,674 | 10/1978 | Comiskey et al. | 307/351 |

Primary Examiner—Stanley D. Miller, Jr.
Assistant Examiner—B. P. Davis
Attorney, Agent, or Firm—Edward J. Kondracki

[57] ABSTRACT

A method and apparatus for processing an analog signal before it is converted into steep-sided pulses wherein a variable D.C. voltage is generated whose variation is representative of the change in values of the negative-going portions of the analog signal. A voltage summing means receives on the one hand the analog signal and on the other hand the variable D.C. voltage to provide steep-sided output pulses in synchronization with the "significant" portions of the analog signal.

3 Claims, 8 Drawing Figures

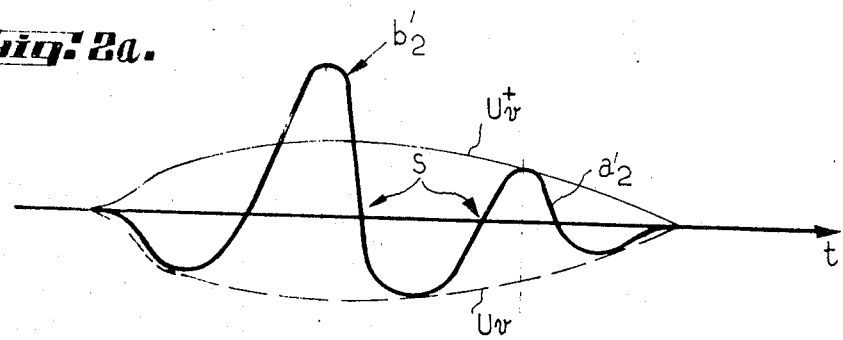
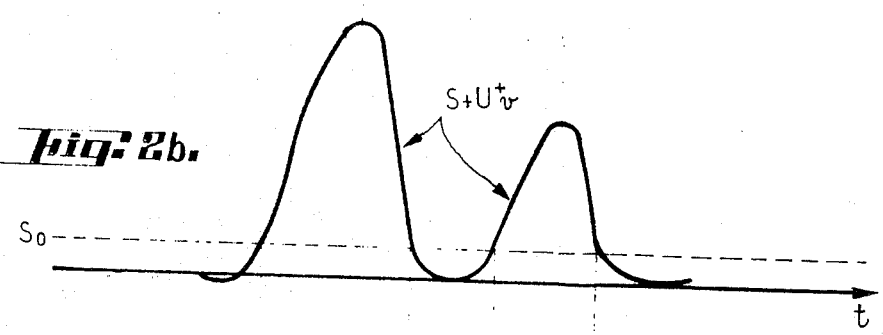
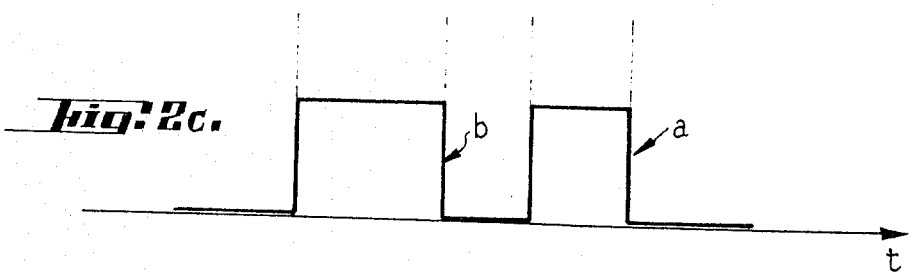

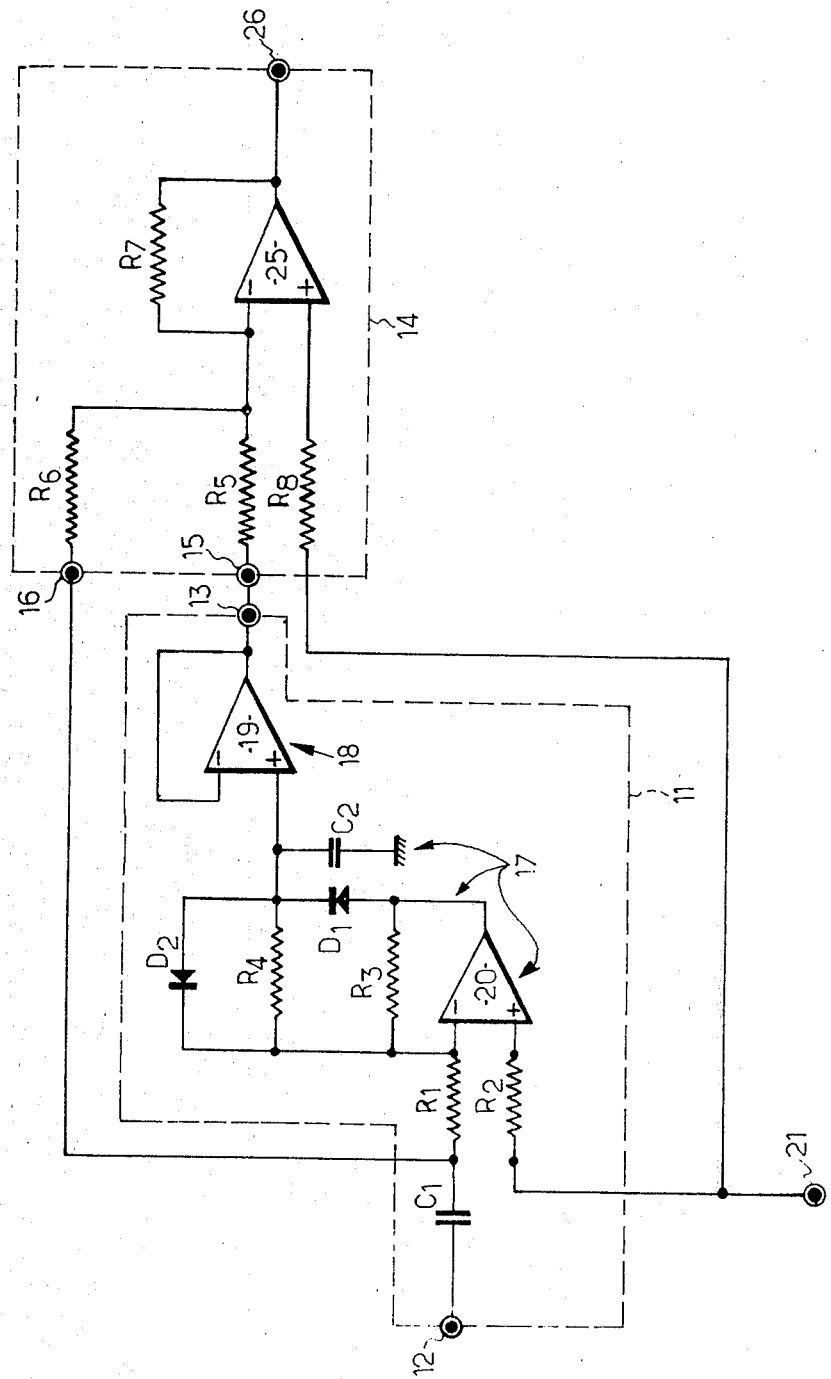

METHOD AND APPARATUS FOR PROCESSING AN ANALOG SIGNAL

BACKGROUND OF THE INVENTION

1. Field of the Invention

The subject invention relates to a method and apparatus for processing a pseudoperiodic analog signal. Such processing is particularly advisable when an analog signal is converted into a succession of steep-sided pulses by a threshold switching circuit, with a view to use in a digital logic processing system.

2. Description of the Prior Art

Problems are frequently encountered when converting a periodic or pseudoperiodic analog signal into steep-sided pulses of constant amplitude. As an example, the situation may be encountered where it is necessary to generate a train of pulses from an analog signal, each pulse being generated in response to and in synchronization with a positive-going (or negative-going) part cycle of the analog signal which is considered to be "significant". It is known however that when employing analog to digital conversion techniques which employ a threshold switching circuit, the length of a pulse generated from what are termed "significant" part cycles become larger as the amplitude of the corresponding significant part cycle becomes higher. If the amplitude is too small, the corresponding pulse may be too short to be "recognized" and taken into account by a digital logic system or it may not even be generated if the peak value of the part cycle is below the threshold level of the threshold switching circuit.

To give a more specific example, there are certain known devices for reading information (i.e. check readers used by banks) which operate by detecting the passage of bars of magnetized ink in front of a magnetoresistive reading head. A reading device of this kind is described in particular in a French patent application No. 78.29848. The individual analog signals emitted by magnetoresistors in response to the passage of a signal bar is formed successively by a negative-going part cycle of low amplitude, a positive-going part cycle of high amplitude and a negative-going part cycle of low amplitude. The electrical energy corresponding to the positive part cycle is equal to the sum of the electrical energies corresponding to the two negative part cycles. The positive part cycle is thus considered to be the "significant" part of the cycle, since there is only a signal positive part cycle for each bar. At the reading magnetoresistor, a closely spaced series of bars produces a pseudoperiodic analog signal resulting from the sum of the individual responses of the kind described above. In the pseudoperiodic signal, each positive part cycle is "significant". Therefore, in principle, it appears that all that would be necessary would be to apply this analog signal to a threshold switching circuit through a simple diode in order to obtain a pulse train to be used by the digital logic system. However, the amplitude of each significant part cycle corresponding to a bar may vary within fairly wide limits in the pseudoperiodic signal since the bars (in particular as they appear on a check) are not necessarily of the same height or the same residual magnetism. The worst case is when an individual signal of high amplitude is generated immediately after an individual signal of low amplitude. In this case, the first negative part cycle of the individual signal of high amplitude is "substracted" from the significant positive part cycle of the individual signal of low amplitude and the steep-sided pulse which is generated from the positive half part cycle of reduced size is then of very brief duration or even, in some cases, completely non-existent.

SUMMARY OF THE INVENTION

The invention enables, inter alia, problems of this kind to be overcome. The basic concept of the invention consists in modifying the analog signal in such a way to increase the amplitude of significant part cycles.

More specifically, the invention relates to a method and apparatus for processing an analog signal containing part cycles having an amplitude lower than and part cycles having an amplitude higher than a predetermined reference level.

In accordance with the method of the invention there is generated a variable D.C. voltage whose variation is representative of the mean value or peak value of one of of the aforementioned types of part cycle, and a voltage proportional to the said variable D.C. voltage is algebraically added to a signal proportional to the said analog signal substantially simultaneously.

In other words, the method enables the analog signal to be combined with the envelope of part cycles of a given type (specifically the negative part cycles in the case mentioned above) with the object of rendering the peak-to-peak excursions of the pseudoperiodic signal "significant", rather than simply its positive-going part cycles.

The method defined above may also be characterized in that, with one of the abovementioned types of part cycle being "significant", the variable D.C. voltage represents the mean value or the peak value of the other type of part cycle and in that the proportional voltage obeys a law of variation which is the inverse of that governing the variable D.C. voltage, in relation to the predetermined reference level.

The invention also relates to apparatus in circuits for processing analog signals comprising a means for generating a variable D.C. voltage which has an input connected to receive the analog signal and an output for the variable D.C. voltage, and, a voltage summing means having two inputs, one of which is connected to receive the said analog signal and the other of which is connected to the output of the said means for generating the variable D.C. voltage.

BRIEF DESCRIPTION OF THE DRAWINGS

The invention will be better understood, and further objects details and advantages will be more clearly apparent in the light of the following explanatory description of the invention, the description being given solely by way of example and with reference to the accompanying non-limiting drawings, in which:

FIGS. 2a to 2c illustrate the method of the invention when applied to the pseudoperiod signal in FIG. 1c and, FIG. 3 is a diagram of an electronic circuit according to the invention for processing the analog signals.

DETAILED DESCRIPTION OF THE PREFERRED EMBODIMENT

Figure 1A:
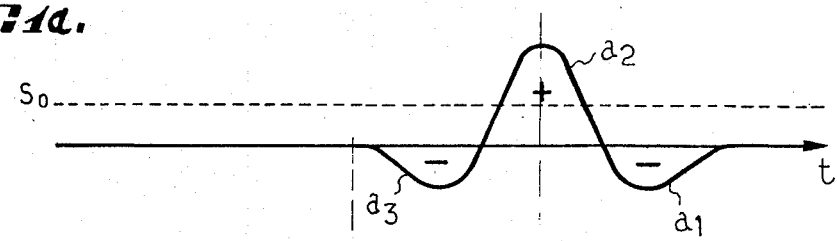
FIGS. 1a to 1d are diagrams plotted with respect to time illustrating the formation of a pseudoperiodic signal from two unit signals, and the steep edged pulses obtained from this signal when it is applied to a threshold switching circuit.

FIG. 1a shows a unit analog signal which is emitted by a magnetoresistive reading head in response to the passage of a bar printed in a magnetized ink. This unit analog signal is formed in succession by a negative-going part cycle $a_1$, a positive-going part cycle $a_2$, and a negative-going part cycle $a_3$. The energy of part cycle of $a_2$ is equal to the sum of the energies of cycles $a_1$ and $a_3$. Furthermore, since it is desired to identify the passage of a bar, it will naturally be part cycle $a_2$ which is considered as "significant", because this part cycle is of greater amplitude than the other two and, in particular, because it is the only one of its kind.

Figure 1B:
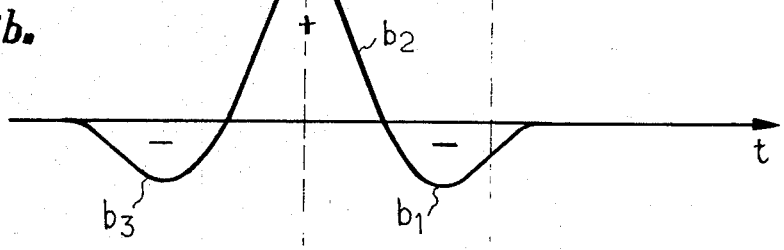
Figure 1C:
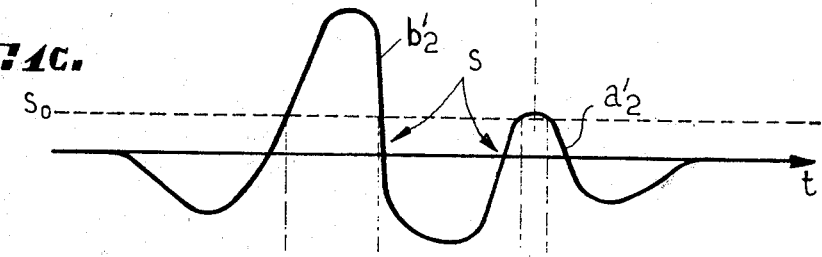
Figure 1D:
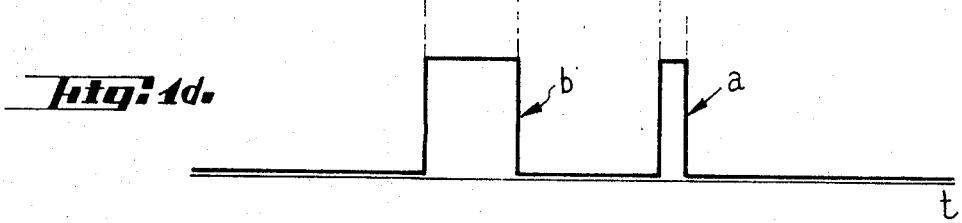

At first blush, it would appear merely to be necessary to use a threshold switching circuit set to a threshold $S_0$ in order to obtain a steep sided pulse for each part cycle $a_2$. However, it can be seen that the unit signal presented in FIG. 1a is of relatively low level. In other words, the peak values of part cycles $a_1$, $a_2$, $a_3$ are relatively low. As mentioned above, all the unit signals corresponding to the various bars are not of the same level. FIG. 1b in fact shows another unit analog signal (successive part cycles $b_1$, $b_2$, $b_3$) corresponding to a bar whose magnetic field is stronger and which immediately follows the other bar which produced the unit analog signal shown in FIG. 1a. It can be seen that a portion of part cycle $b_1$ is generated at the same time as the significant part cycle $a_2$. Since the two part cycles are of opposite signs, the reading head which combines the signals will in fact emit a pseudoperiodic analog signal S as shown in FIG. 1c, in which it is at once apparent that the significant part cycle $a'_2$ (which corresponds to part cycle $a_2$) has been considerably attenuated as compared with its anticipated value shown in FIG. 1a, and this has occurred because of the negative part cycle $b_1$. The unfortunate result of this "overlap" between individual responses of high and low amplitude is illustrated by FIG. 1d which shows the pulses which would result at the output of a threshold switching circuit (set to threshold $S_0$) which received at its input the pseudoperiodic signal shown in FIG. 1c. It can be seen that the duration of the pulse a (deriving from the significant half cycle $a'_2$ of recuced size) is very short as compared in particular with the duration of the pulse b originating from the significant half cycle $b'_2$. It will be appreciated that if the situation is even less favorable (that is to say if the peak value of half cycle $a'_2$ falls below the threshold value $S_0$) pulse a may be completely absent, causing a reading error.

FIGS. 2a to 2c illustrate the results of the present invention as it operates on the pseudoperiodic analog signal in FIG. 1c. The process begins with the generation of a variable D.C. voltage $U_v$ whose variation is substantially representative of the changes in the peak value (or it could also be the mean value) of the negative part cycles of analog signal S. Thus, to some degree, this negative voltage is represented by the envelope $U_v$ of the negative part cycle signal S, as shown by the dash lines in FIG. 2a. By using conventional electronic means, a voltage $V_v+$ is generated from $U_v$, this positive voltage is proportional to voltage $U_v$ and, of course, is of the opposite sign in the example illustrated. This proportional voltage $U_v+$ is added algebraically to the analog signal S itself, so as to produce the analog $S+U+_v$ shown in signal FIG. 2b. When this later signal is applied to the input of a threshold switching circuit which is adjusted to the same threshold $S_0$ as above, the resulting pulses will be shown in FIG. 2c, from it can be seen by a comparison with FIG. 1d that the length of the pulses in question has been very substantially increased, in particular in the case of pulse a. It should be mentioned that in the above example the part cycles were referred to as positive and negative, because the reference level mentioned above was selected to be equal to a zero potential, but it would be perfectly possible for the reference level itself to be a positive or negative voltage, i.e. of other than zero level. It would still be possible to generate a voltage $U_v$ represnting the mean value or peak value of the part cycles lower than (or higher than) the reference level and to generate from this voltage $U_v$ another voltage $U_v+$ which obeys a law of variation, relative to the reference level, inverse to that obeyed by voltage $U_v$.

A description will now be given with reference to FIG. 3, of an elecronic circuit capable of putting the method described above into practice.

The circuit comprises essentially a means 11 for generating a variable D.C. voltage which has an input 12 to receive the psedoperiodic analog signal shown in FIG. 1c and an output 13 for the variable D.C. voltage, as well as a voltage summing means 14 having two inputs 15 and 16. Input 15 is connected to output 13.

The means for generating the variable D.C. voltage comprises essentially a peak voltage follower arrangement 17 which is connected to receive the analog signal S applied to input 12. The follower arrangement is supplemented by a coupling stage formed by a simple amplifier 18 whose output coincides with output 13. In the example being described, the amplifier is formed by a differential amplifier 19 having a very high open-loop gain whose output is however directly connected to its inverting input to form an amplifier having a gain equal to unity. The non-inverting input receives the signal from the follower arrangement 17. The latter comprises a first differential amplifier 20 whose inverting input is connected to input 12 via a resistor $R_1$ and a compacitor $C_1$ connected in series, and whose noninverting input receives a constant D.C. reference voltage applied to terminal 21, via a resistor $R_2$. This constant D.C. voltage in fact represents the predetermined reference or threshold level mentioned above, since it enables the quiescent voltage of the amplifier 20 to be determined. This shift in the operating point of the amplifier (and of the entire system) about a given positive voltage, is advantageous since it avoids the need to supply the differential amplifier 20 from two voltage sources, one positive and the other negative. By virtue of this voltage shift, only one positive supply voltage is required. A negative feedback circuit is connected between the output of the different amplifier 20 and its inverting input. This negative feedback circuit comprises a resistor $R_3$ connected in parallel with a resistor $R_4$ and diode $D_1$ connected in series with one another. Another diode $D_2$ whose function will be explained below may also be connected in parallel with resistor $R_4$, its cathode being connected to the inverting input of differential amplifier 20. The anode $D_1$ is connected to the output of differential amplifier 20 and its cathode is connected to a capacitor $C_2$ and to the input of amplifier 19. The other terminal of capacitor $C_2$ is connected to a reference potential, such as ground potential. Resistors $R_3$ and $R_4$ (and also diode $D_2$) form part of a discharge circuit for capacitor $C_2$, whereas diode $D_1$, in conjunction with amplifier 20, forms part of a charging circuit for the same capacitor.

The time constant of the discharge circuit (and thus to some degree the value of capacitor $C_2$) is selected as a function of the mean frequency of the pseudoperiodic signal to enable capacitor $C_2$ to remain charged to a value close to the peak voltage of the part cycles of the output signal from amplifier 20 which are transmitted to it by diode $D_1$.

As regards the voltage summing means, this is formed by a second differential amplifier 25. The two inputs 15 and 16 are both connected to the inverting input of amplifier 25 via respective resistors $R_5$ and $R_6$. A resistor $R_7$ is connected between the output of differential amplifier 25 (which is also the output 26 of the system) and its inverting input. Since the open-loop gain of differential amplifiers 25 is very high, it will be realized that this is a conventional layout for a voltage summing circuit. Furthermore, the non-inverting input of differential amplifier 25 is connected to terminal 21 via a resistor $R_8$ in order to shift the operating point of this amplifier as above. Input 16 is connected to the common point of $C_1$ and $R_1$.

Diode $D_2$ could be replaced by some other component having a non-linear characteristic, provided that this component allows the charge in capacitor $C_2$ to be restricted progressively, at least from a certain threshold, for at least the highest amplitudes of the analog signal. The operation of the arrangement which has just been described will be clearly apparent from the foregoing. Since the analog signal applied to input 12 is fed to the inverting input of differential amplifier 20, it is the variations in the negative part cycle of the said signal which are fed, via diode $D_1$ to capacitor $C_2$ and which charge it to a variable D.C. voltage representing the change in the peak voltages in negative part cycles of the input signal.

It will thus be seen that the differential amplifier 20 does in fact "invert" the analog signal itself, which enables the variable D.C. voltage $U_v+$ illustrated in FIG. 2a to be obtained directly (by means of diode $D_1$ and capacitor $C_2$). This illustrates that there are a large number of electronic circuits which could readily be designed to generate the voltages $U_v$ and/or $U_v+$ without exceeding the scope of the invention. Since the voltage at the terminals of capacitor $C_2$ is substantially the voltage $U_v+$, this voltage is thus applied to the input 15 of the voltage summing means 14 via amplifier 19. This voltage $U_v+$ is thus added to the input signal which is applied to input 16 via capacitor $C_1$. The analog signal available from output 26 thus conforms closely to what is shown in FIG. 2b, except that the direction or variation is merely reversed, which does not represent any kind of disadvantage as regards the use of the output signal.

The invention is not of course in any way restricted to the embodiment of the arrangement which has just been described. In particular, the value of capacitor $C_2$ and the characteristics of its discharge circuit could be altered to enable the variable D.C. voltage present at its terminals to be representative of the mean value of the negative part cycles of the input signal. Accordingly, it is intended to encompass all technical equivalents of the illustrated embodiment which fall within the true spirit and full scope of the invention as defined in the following claims.

I claim:

1. A circuit for processing analog signals comprising generating means for generating a variable D.C. voltage and having an input connected to receive the said analog signals and an output for said variable D.C. voltage, said generating means comprising:
   (a) a peak voltage following arrangement including a first differential amplifier having an inverting input connected to receive the said analog signals through a first capacitor connected to said generating means input, a noninverting input connected to receive a D.C. reference voltage, and an output, a second capacitor having one of its electrodes connected to a ground potential, a diode connected between the output of said first differential amplifier and the other electrode of said second capacitor to charge the latter, and a discharge circuit for the said second capacitor which, in conjunction with said second capacitor, defines a selected time constant, and
   (b) an amplifier having an input connected to said other electrode of said second capacitor and an output connected to said output of said generating means, and voltage summing means having two inputs, one of which is connected to receive the said analog signals through said first capacitor and the other of which is connected to the output of said generating means, and an output for delivering a succession of steep-sided pulses responsive to analog signals applied to said circuit.

2. A circuit according to claim 1, wherein said voltage summing means includes a second differential amplifier, having an inverting input connected to said two inputs of the said voltage summing means via respective resistors and a non inverting input connected to receive said D.C. reference voltage.

3. A circuit according to claims 1 or 2, wherein said discharge circuit comprises a diode component having a non-linear characteristic, said component being connected between said other electrode of said second capacitor and said inverting input of said first differential amplifier to restrict the charge in the said second capacitor progressively for at least the highest amplitudes of the said analog signals.

* * * * *